United States Patent
Yang

(10) Patent No.: US 7,052,960 B2
(45) Date of Patent: May 30, 2006

(54) METHOD FOR MANUFACTURING A FLASH MEMORY DEVICE

(75) Inventor: In Kwon Yang, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/126,333

(22) Filed: May 11, 2005

(65) Prior Publication Data

US 2006/0019446 A1    Jan. 26, 2006

(30) Foreign Application Priority Data

Jul. 23, 2004  (KR) ...................... 10-2004-0057617

(51) Int. Cl.
*H01L 21/336*    (2006.01)
(52) U.S. Cl. ...................... 438/257; 438/264; 257/315
(58) Field of Classification Search ................ 438/257, 438/264; 257/315
See application file for complete search history.

(56) References Cited

U.S. PATENT DOCUMENTS

| | | | |
|---|---|---|---|
| 6,281,050 B1 * | 8/2001 | Sakagami | .................... 438/142 |
| 2004/0056293 A1 * | 3/2004 | Saito | .......................... 257/296 |
| 2004/0079972 A1 * | 4/2004 | Yoon | .......................... 257/215 |
| 2005/0258471 A1 * | 11/2005 | Lee | ............................ 257/315 |

* cited by examiner

*Primary Examiner*—Trung Dang
(74) *Attorney, Agent, or Firm*—Mayer, Brown, Rowe & Maw LLP

(57) ABSTRACT

A method of manufacturing a flash memory device by carrying out the process of shallow trench isolation (STI) in a memory cell region, so that it decreases an aspect ratio of pattern by forming a field isolation film so as to reduce gap-filling defects due to high density plasma (HDP) and to prevent the smiling effect at a tunnel oxide film so as to improve a programming speed of the flash memory device. The method also conducts the process of self-aligned shallow trench isolation (SA-STI) in a peripheral circuit region by forming a field isolation film, so that it prevents degradation in the characteristics of high and low voltage gate oxide films.

11 Claims, 4 Drawing Sheets

METHOD FOR MANUFACTURING A FLASH MEMORY DEVICE

BACKGROUND

1. Field of the Invention

The present invention relates to a method of manufacturing a flash memory device. More specifically, the present invention relates to a method of manufacturing a flash memory device, which prevents a smiling effect at a tunnel oxide film arising from a cell region and a gap-filling defect at a field isolation film when the process of self-aligned shallow trench isolation (SA-STI) is adopted therein.

2. Discussion of Related Art

In general, a field isolation film is formed by means of a shallow trench isolation (STI) process or a self-aligned shallow trench isolation (SA-STI) process.

In the STI process, an oxide film and a nitride film are sequentially formed on a semiconductor substrate and an etching process is then performed to form a trench in a field isolation region of the substrate. In the SA-ATI process, an oxide film, a polycrystalline silicon film, and a nitride film are sequentially formed on a semiconductor substrate and an etching process is then performed to form a trench.

In manufacturing a flash memory device using the STI process, a nitride film is formed on a gate oxide film in a periphery region. Accordingly, there is a problem in that an etching damage is occurs at the gate oxide film during removal of the nitride film.

In addition, in manufacturing a flash memory device using the SA-STI process, a polycrystalline silicon film is formed between an oxide film and a nitride film to protect the gate oxide film from etching damage. However, an aspect ratio of a trench is increased due to the polycrystalline film and the aspect ratio of the trench in a cell region having narrow pattern width is increased. Therefore, there are problems in that a filling characteristic of insulating material begins deteriorating and a void is formed in the field isolation film. Also, there is a problem in that a smiling effect because both ends of a tunnel oxide film become thick during subsequent thermal process since the SA-STI process is performed after forming the tunnel oxide film.

SUMMARY OF THE INVENTION

The present invention is directed to solve the above-mentioned problems by providing a method of manufacturing a flash memory device that is capable of preventing a smiling effect at a tunnel oxide film arising from a cell region and a gap-filling defect at a field isolation film during the process of self-aligned shallow trench isolation (SA-STI).

An aspect the present invention is to provide a method of manufacturing a flash memory device that includes providing a semiconductor substrate in which, a pad oxide film is formed in a cell region, a low voltage gate oxide film is formed in a low voltage field, and a high voltage gate oxide film is formed in a high voltage field. The method may also include forming a first polycrystalline silicon film in the low and high voltage fields, depositing a pad nitride film on the overall structure including the first polycrystalline silicon film, and forming a first trench from partially patterning the pad nitride film, the pad oxide film, and the semiconductor substrate in the cell region. Additionally, the method may further include forming second and third trenches from partially patterning the pad nitride film, the pad oxide film, and the semiconductor substrate in the low and high voltage fields; forming a field isolation film to fill up the first through third trenches; removing the pad nitride film; forming a tunnel insulation film on the overall structure where the field isolation film is formed; and forming a floating gate from depositing and patterning a second polycrystalline silicon film on the tunnel insulation film.

BRIEF DESCRIPTION OF THE DRAWINGS

The accompanying drawings are included to provide a further understanding of the invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
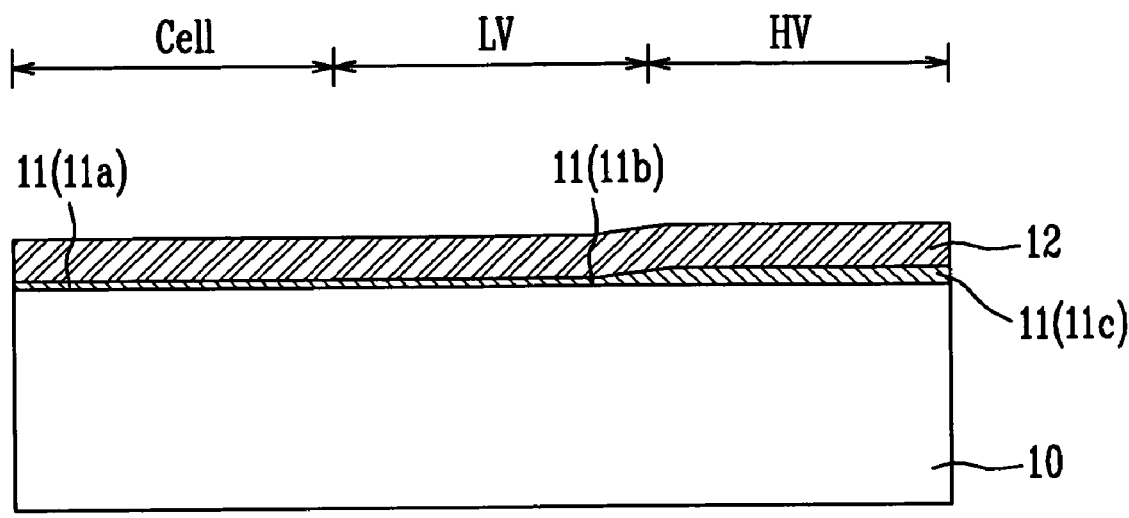
FIGS. 1 through 8 are sectional diagrams illustrating processing steps for a method of manufacturing a flash memory device in accordance with an embodiment of the present invention.

Embodiments of the present invention will be described below in more detail with reference to the accompanying drawings. The present invention may, however, be embodied in different forms and should not be constructed as limited to the embodiment(s) set forth herein. Rather, these embodiments are provided so that this disclosure will be thorough and complete, and will fully convey the scope of the invention to those skilled in the art. In the drawings, the thickness of layers and regions are exaggerated for clarity. Additionally, in the drainage, like numerals refer to like elements throughout the specification. It will also be understood that when a layer is referred to as being "on" another layer or substrate, it can be directly on the other layer or substrate, or intervening layers may also be present.

FIGS. 1 through 8 are sectional diagrams illustrating processing steps for a method of manufacturing a flash memory device in accordance with an embodiment of the present invention. Hereinafter, a cell region is represented as 'cell', a high voltage field is represented as 'HV', and a low voltage field is represented as 'LV', in convenience of description.

Referring to FIG. 1, a semiconductor substrate 10 that has been treated by a pre-cleaning process is provided. The pre-cleaning process is conducted by using SC-1 (a solution mixed with $NH_4OH/H_2O_2/H_2O$ solutions in a predetermined ratio) after cleaning the substrate with DHF (diluted HF; e.g., a HF solution mixed with $H_2O$ in the ratio of 50:1), or by using the SC-1 after cleaning the substrate with BOE (buffer oxide etchant; e.g., a solution mixed with $NH_4H$ and HF solution and with $H_2O$ in the ratio of 100:1 or 300:1).

Next, a screen oxide film (not shown) is formed on the semiconductor substrate 10. Here, the screen oxide film is provided to prevent damage at the boundary surface of the semiconductor substrate 10 due to an ion implantation process subsequent thereto.

Then, the ion implantation process is carried out for the semiconductor substrate 10 to form a well (not shown). If the semiconductor substrate 10 is a P-type substrate, the well may be formed to be a Triple N-well (TN-well) and P-well. The TN-well is formed by the ion implantation process with phosphorous (P), while the P-well is formed by the ion implantation process with boron (B).

Next, an ion implantation process is further conducted to regulate a threshold voltage and form a channel in the semiconductor substrate 10.

Next, an oxide film 11 is deposited on the semiconductor substrate 10. Here, the oxide film 11 is formed to be thicker in the high voltage field HV than in the cell region Cell and the low voltage field LV. As an example, the procedure of forming the oxide film 11 is as follows. First, a wet oxidation process is carried out to form a thin oxide film over the overall structure including the cell region Cell, the low voltage field LV, and the high voltage field HV, and thereafter a further wet oxidation process is carried out to form the thick oxide film 11 in the high voltage field HV by using a mask for opening the high voltage field HV. The oxide film 11 may be formed by way of an annealing process with $N_2$ in the temperature range of about 900 to 910° C. after conducting a wet oxidation process in the temperature range of about 750 to 800° C.

The part of the oxide film formed in the cell region Cell is referred to as a pad oxide film 11a, the part of the oxide film 11 formed in the low voltage field LV is referred to as a low voltage gate oxide film 11b, and the part of the oxide film formed in the high voltage field HV is referred to as a high voltage gate oxide film 11c, in convenience of description.

After forming the oxide films 11a, 11b, and 11c, a polycrystalline silicon film 12 (hereinafter, referred to as 'first polycrystalline silicon film') is deposited over the overall structure including the pad oxide film 11a, the low voltage gate oxide film 11b, and the high voltage gate oxide film 11c. During this, it is preferable for the first polycrystalline silicon film 12 to be deposited with a thickness of about 300 to 500 Å under low pressure (about 0.1 to 0.3 torr) and in a temperature range of about 530 to 680° C. Otherwise, the first polycrystalline silicon film 12 may be formed of an undoped amorphous silicon film having low oxidizing resistance, or a doped amorphous silicon film having low doping concentration. Here, the undoped amorphous silicon film may be deposited by way of low pressure chemical vapor deposition (LPCVD) with $SiH_4$ gas under low pressure of about 0.1 to 0.3 torr and in a temperature range of about 480 to 550° C. The doped amorphous silicon film of low concentration may be deposited by way of LPCVD with $Si_2H_6$ and $PH_3$ gas under low pressure of about 0.1 to 0.3 torr and in a temperature range of about 480 to 550° C.

Figure 2:
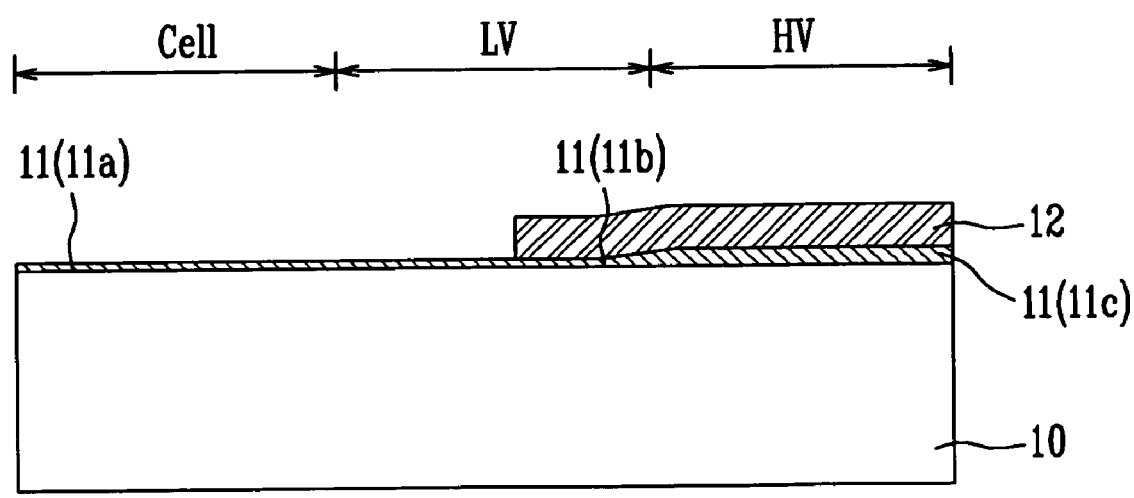

Referring to FIG. 2, after depositing a photoresist film on the first polycrystalline silicon film 12, an exposing and developing process is carried out with a photomask to form a photoresist pattern (not shown).

Then, an etching process is conducted to pattern the first polycrystalline silicon film 12 deposited in the cell region Cell, using the photoresist pattern as an etching mask. During this, the first polycrystalline silicon film 12 deposited in the low voltage field LV is partially removed by the patterning process. As a result, the pad oxide film 11a of the cell region Cell is disclosed. In embodiments, it is preferable for the etching process to be carried out to minimize loss of the pad oxide film 11c by means of a higher etch ratio between the first polycrystalline silicon film 12 and the pad oxide film 11c. For example, the etching process may be conducted by employing an apparatus that uses a source with transformer coupled plasma (TCP) or magnetically enhanced reactive ion beam etching (MERIE) plasma, utilizing gas in the type of $CL_2/O_2$, $HBr/O_2$, and $He/HBr/O_2$ where $Cl_2/O_2=5:1$, $HBr/O_2=150:1$ to 200:1, and $He/HBr/O_2=75:140:1$ or 70:150:1, under pressure of about 10 to 30 mT, in biasing power of about 60 to 200 W, and top and source power of about 300 to 500 W.

Next, the photoresist pattern is removed by a striping process.

Figure 3:
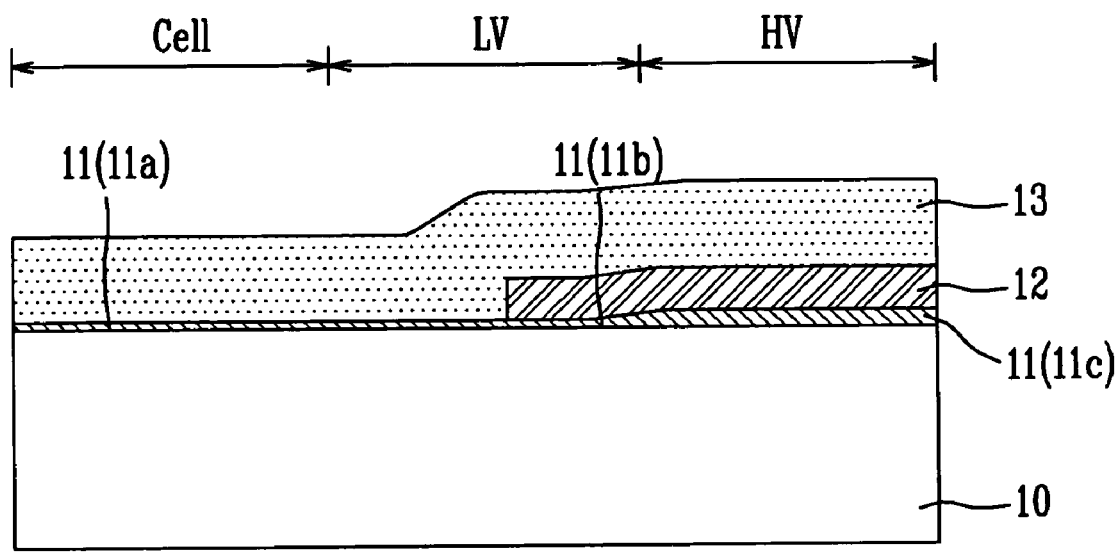

Referring to FIG. 3, a pad nitride film 13 is deposited on the overall structure including the first polycrystalline silicon film 12 that is patterned through the former process. Here, the pad nitride film 13 may be deposited with a thickness of at least about 500 Å by means of LPCVD.

Figure 4:
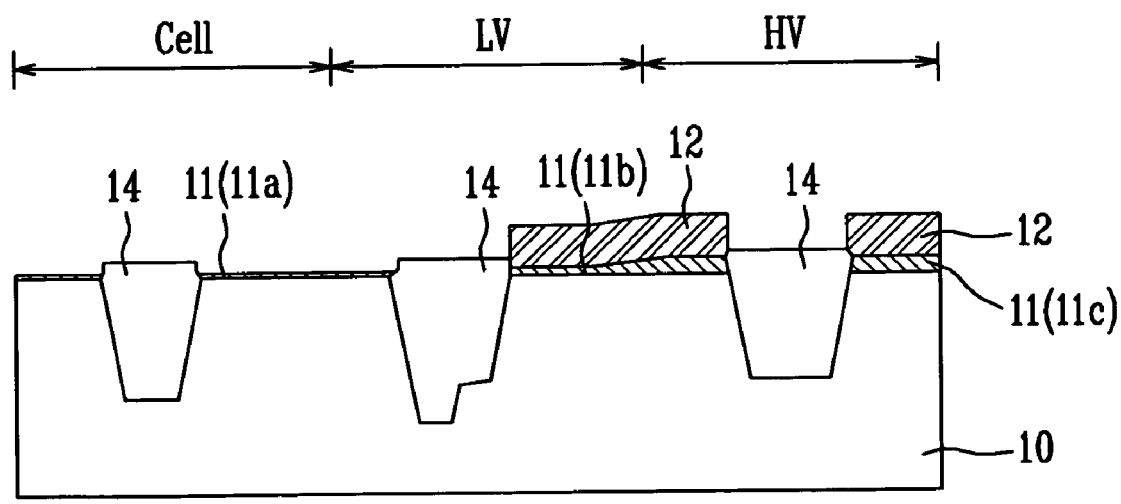

Referring to FIG. 4, after depositing a photoresist film on the pad nitride film 13, an exposing and developing process is carried out with a photomask to form a photoresist pattern (not shown) that is used as an etching mask to form a trench in the cell region Cell.

Then, an etching process using the photoresist pattern as an etching mask is conducted to form the trench (not shown) in the cell region Cell, partially etching away the pad nitride film (refer to 13 of FIG. 3), the pad oxide film 11a, and the semiconductor substrate 10 in the cell region Cell.

And then, the photoresist pattern is removed by a striping process.

Next, after depositing a photoresist film on the overall structure where the trench is formed, an exposing and developing process is carried out with a photomask to form a photoresist pattern (not shown). The photoresist pattern is formed to partially open the low voltage field LV and the high voltage field HV, being used as an etching mask to define trenches in the low and high voltage fields LV and HV.

Then, an etching process using the photoresist pattern as an etching mask is conducted to form the trenches (not shown) in the low and high voltage fields LV and HV, partially etching away the pad nitride film (refer to 13 of FIG. 3), the low voltage gate oxide film 11b, the high voltage gate oxide film 11c, and the semiconductor substrate 10 in the low and high voltage fields LV and HV.

A wall oxide film (not shown) is deposited in the trenches that are formed in the cell region Cell, the low voltage field LV, and the high voltage field HV, by way of a wall oxidation process. The wall oxidation process may be carried out in the type of dry oxidation in order to cure sidewalls of the trenches that have been damaged during the preceding process for forming the trenches. Here, the dry oxidation process may be prosecuted with the condition of setting a deposition target in the thickness of about 50 to 150 Å and under a temperature range of about 700 to 1000° C.

Next, a field isolating insulation film 14 is deposited on the overall structure in which a liner oxide film is formed, gap-filling the trenches of the cell region Cell, the low voltage field LV, and the high voltage field HV. During this, the field isolating insulation film 14 is formed of an HDP oxide film. Here, the HDP oxide film is preferred to be deposited with a thickness of about 4000 to 10000 Å. After depositing the field isolating insulation film 14 of the HDP oxide film, an annealing process is conducted for curing the structure.

Then, a planarization process is carried out for the entire surface of the overall structure. The planarization process may be conducted by means of CMP, obtaining an effective FOX height (EFH) with uniformity over the wafer.

Next, an etching process with phosphoric acid ($H_3PO_4$) is conducted to remove the pad nitride film 13. As a result, the field isolation film 14 is each completed in the cell region Cell, the low voltage field LV, and the high voltage HV.

Figure 5:
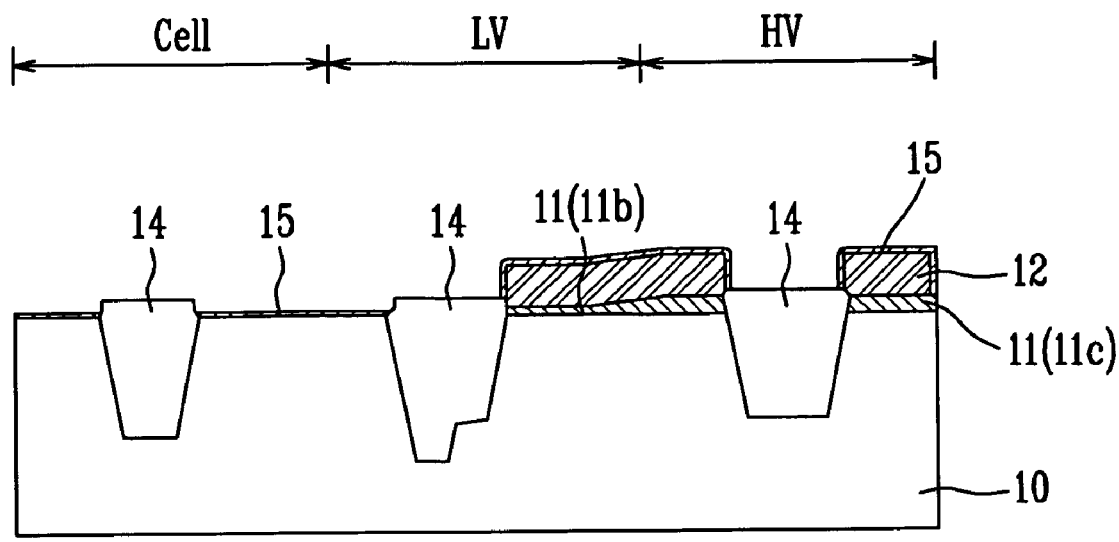

Referring to FIG. 5, the tunnel insulation film 15 is deposited on the overall structure where the field isolation film 14 is formed. The tunnel insulation film 15 may be formed of an oxide film with a thickness of about 60 to 90 Å by way of an annealing process with $N_2$ gas for about 20 to 30 minutes after completing a wet oxidation process at a temperature of about 50 to 850° C. Otherwise, the tunnel insulation film 15 may be formed of a nitride oxide film with a thickness of about 70 to 100 Å by way of an annealing process with $N_2$ gas of 10 sccm for about 10 to 30 minutes at a temperature of about 50 to 850° C. after forming a pure oxide film with a thickness of about 60 to 90 Å. In addition, a post annealing process may be performed subsequent thereto for about 5 to 30 minutes by means of $N_2$ gas at a temperature of about 900 to 950° C.

Before forming the tunnel insulation film 15, a pre-cleaning process is carried out for the entire surface of the overall structure. The pre-cleaning process is provided to completely eliminate all oxide films (including the pad oxide film) remaining on the entire surface of the overall structure. Here, the pre-cleaning process may be performed through two steps: a first step using DHF; and a second step using SC-1 ($NH_4OH/H_2O_2/H_2O$).

Figure 6:
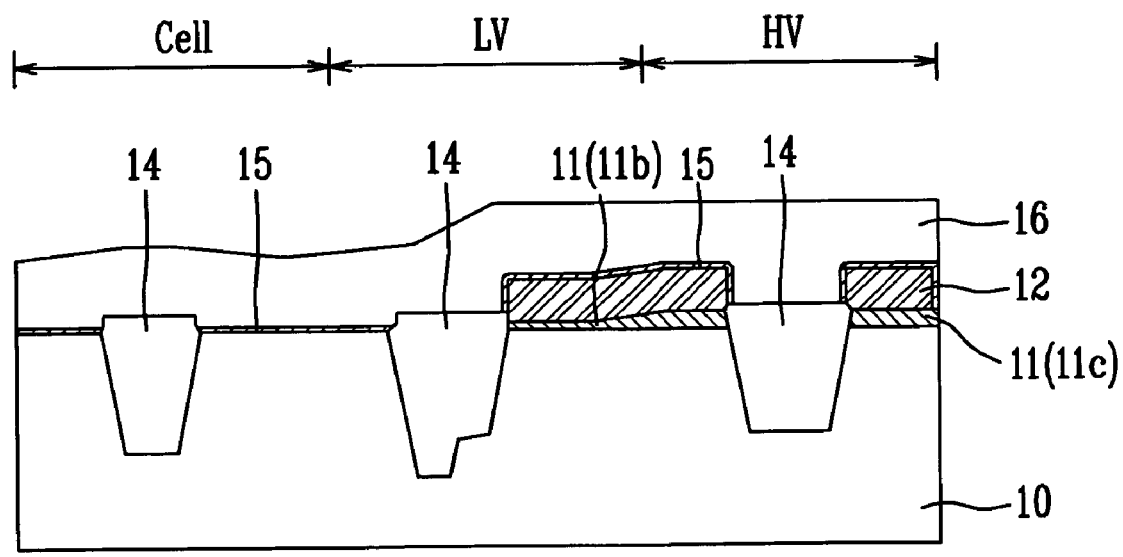

Referring to FIG. 6, an additional polycrystalline silicon film 16 (hereinafter, referred to as 'second poly crystalline silicon film') is deposited on the overall structure where the tunnel insulation film 15 is formed. Here, the second polycrystalline silicon film 16 may be formed in the same way as the first polycrystalline silicon film 12.

Figure 7:
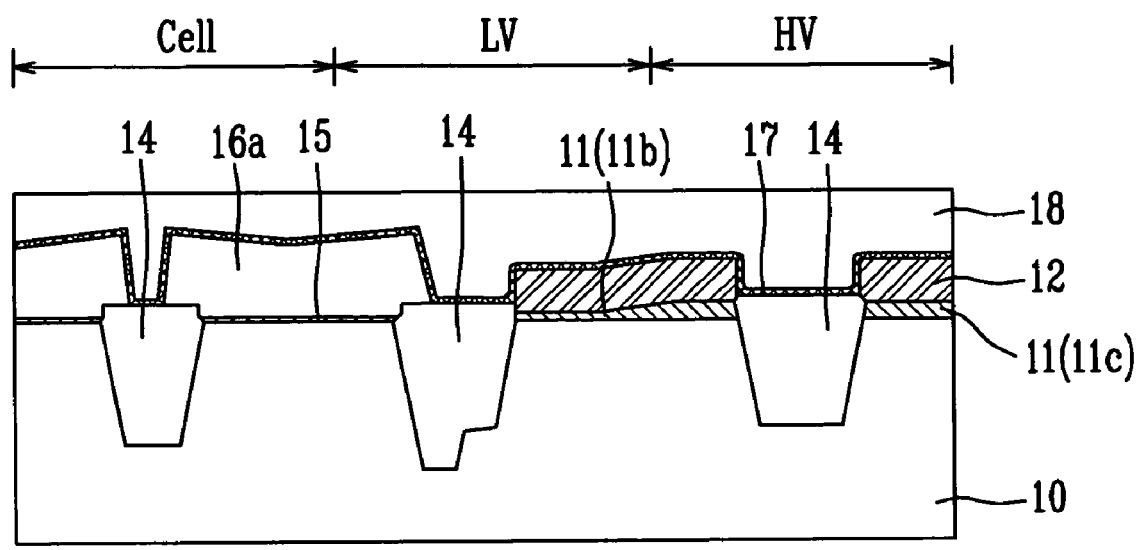

Referring to FIG. 7, after forming an etching mask for floating gate by way of a lithography process, an etching process with the etching mask is carried out to pattern the second polycrystalline silicon film (refer to the reference numeral 16 shown in FIG. 6). As a result, a floating gate 16*a* is formed in the cell region Cell. During this process, in embodiments, it may be preferable for the etching process to be conducted in a condition with a higher etch ratio between polycrystalline silicon film and oxide film. Thus, the field isolation film 14 functions to stop etching in the cell region Cell, while an oxide film interposed between the first and second polycrystalline silicon films 12 and 16 function to stop etching in the peripheral circuit region.

Next, a dielectric film 17 is formed along the step coverage on the surface of the overall structure. The dielectric film 17 may be formed of an oxide/nitride/oxide (ONO) film. For example, an oxide film as the lowest layer of the dielectric film 17 may be formed of DCS-HTO with a thickness of about 40 to 60 Å and at a temperature range of about 800 to 850° C. A nitride film as the intermediate layer of the dielectric film 17 may be formed with a thickness of about 40 to 80 Å at temperature of about 600 to 700° C. Finally, an oxide film as the highest layer of the dielectric film 17 may be formed of DCS-HTO with a thickness of about 40 to 60 Å at a temperature range of about 800 to 850° C.

An additional polycrystalline silicon film 18 (hereinafter, referred to as 'third poly crystalline silicon film') is deposited on the overall structure where the dielectric film 17 is formed. Here, the third polycrystalline silicon film 18 may be formed with a thickness of about 300 to 600 Å in the same way as the second polycrystalline silicon film (refer to the reference numeral 16 of FIG. 6). However, the thickness and processing condition for the third polycrystalline silicon film may be modified in accordance with a characteristic of the flash memory device.

Next, the third polycrystalline silicon film 18 may be flattened by means of a CMP process.

Figure 8:
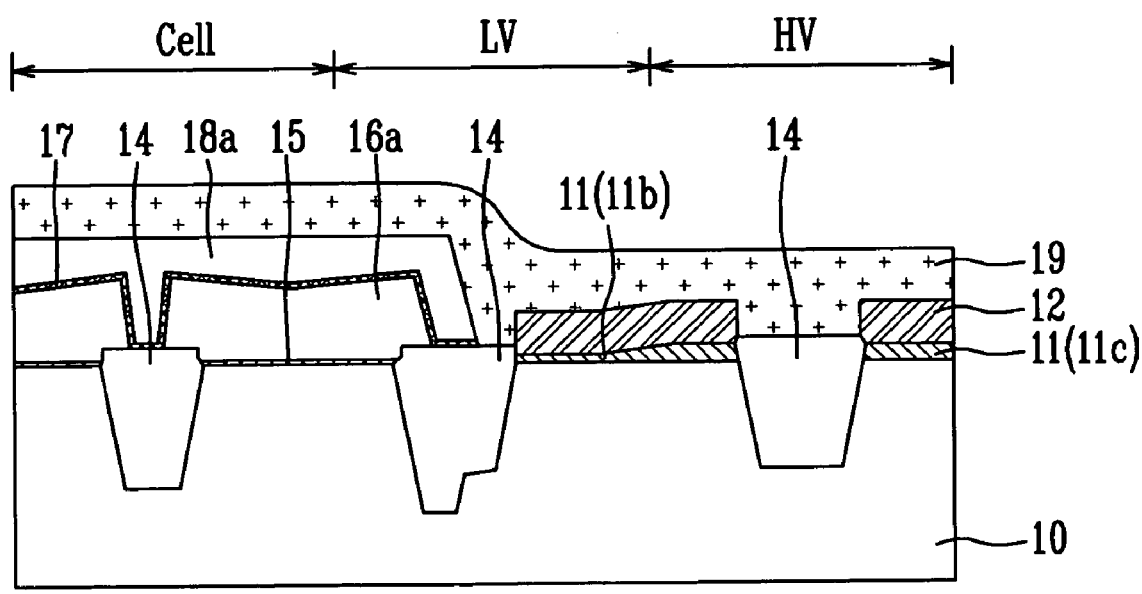

Referring to FIG. 8, after forming an etching mask for control gate by way of a lithography process, an etching process with the etching mask is carried out to pattern the third polycrystalline silicon film (refer to the reference numeral 18 shown in FIG. 7). As a result, a control gate 18*a* is formed in the cell region Cell, covering the floating gate 16*a*.

Next, an etching process is carried out to remove the dielectric film 17 disposed in the low and high voltage fields LV and HV that are not covered by the control gate 18*a*. During this, the etching process is sequentially conducted by means of a wet etching process with a hot phosphoric acid and a solution containing HF.

Then, an additional polycrystalline silicon film 19 (hereinafter, referred to as 'fourth poly crystalline silicon film') is deposited on the overall structure where the control gate 18*a* is formed. Here, the fourth polycrystalline silicon film 19 may be formed in the same way as the third polycrystalline silicon film (refer to the reference numeral 18 of FIG. 7). However, the thickness and processing condition for the fourth polycrystalline silicon film may be modified in accordance with a characteristic of the flash memory device.

Meanwhile, before forming the fourth polycrystalline silicon film 19, a pre-cleaning process may be carried out for the entire surface of the overall structure. The pre-cleaning process is provided to completely eliminate all oxide films remaining on the first polycrystalline silicon film (refer to the reference numeral 12 of FIG. 1) of the low and high voltage fields LV and HV. Here, the pre-cleaning process may be performed through two steps: a first step using DHF; and a second step using SC-1 ($NH_4OH/H_2O_2/H_2O$).

The subsequent processing steps are carried out in the same ways as general processes and methods, so further description will not be provided.

As aforementioned, the method of manufacturing a flash memory device according to the present invention forms the field isolation film by means of the STI process for the cell region, so that it decreases an aspect ratio of pattern from forming a field isolation film so as to reduce gap-filling defects due to high density plasma (HDP) and prevents the smiling effect at a tunnel oxide film so as to improve a programming speed of the flash memory device. The method according to the present invention also conducts the process of self-aligned shallow trench isolation (SA-STI) in a peripheral circuit region for forming a field isolation film, so that it prevents degradation in the characteristics of high and low voltage gate oxide films.

Although the present invention has been described in connection with the above embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method of manufacturing a flash memory device, the method comprising:
    providing a semiconductor substrate on which a pad oxide film is formed in a cell region, a low voltage gate oxide film is formed in a low voltage field, and a high voltage gate oxide film is formed in a high voltage field;
    forming a first polycrystalline silicon film in the low and high voltage fields;
    depositing a pad nitride film on the overall structure including the first polycrystalline silicon film;
    forming a first trench by partially patterning the pad nitride film, the pad oxide film, and the semiconductor substrate in the cell region;
    forming second and third trenches by partially patterning the pad nitride film, the pad oxide film, and the semiconductor substrate in the low and high voltage fields, respectively;
    forming a field isolation film to fill up the first through third trenches;

removing the pad nitride film;

forming a tunnel insulation film on the overall structure where the field isolation film is formed; and forming a floating gate by depositing and patterning a second polycrystalline silicon film on the tunnel insulation film.

2. The method as set forth in claim 1, wherein the first polycrystalline silicon film is formed with a thickness range of about 300 to 500 Å.

3. The method as set forth in claim 1, further comprising: removing the pad oxide film remaining in the cell region by means of a pre-cleaning process before forming the tunnel insulation film.

4. The method as set forth in claim 1, wherein a dielectric film deposited in the low and high voltage fields while patterning the second polycrystalline silicon film acts as an etch stopping layer.

5. The method as set forth in claim 1, wherein forming the first polycrystalline silicon film further comprises: depositing the first polycrystalline silicon film on the overall structure including the pad oxide film, the low voltage gate oxide film, and the high voltage gate oxide film; and retaining a part of the first polycrystalline silicon film in the low and high voltage fields but removing the other part of the first polycrystalline silicon film from the cell region.

6. The method as set forth in claim 1, further comprising: forming a dielectric film on the overall structure including the floating gate; and forming a control gate to cover the floating gate by depositing and patterning a third polycrystalline silicon film on the dielectric film.

7. A flash memory device, comprising:

a semiconductor substrate on which a pad oxide film is formed in a cell region, a low voltage gate oxide film is formed in a low voltage field, and a high voltage gate oxide film is formed in a high voltage field;

a first polycrystalline silicon film in the low and high voltage fields;

a pad nitride film on the overall structure including the first polycrystalline silicon film;

a first trench formed by partially patterning the pad nitride film, the pad oxide film, and the semiconductor substrate in the cell region;

second and third trenches formed by partially patterning the pad nitride film, the pad oxide film, and the semiconductor substrate in the low and high voltage fields, respectively;

a field isolation film to fill up the first through third trenches;

a tunnel insulation film on the overall structure where the field isolation film is formed; and a floating gate formed by depositing and patterning a second polycrystalline silicon film on the tunnel insulation film.

8. The device as set forth in claim 7, wherein the first polycrystalline silicon film is formed to a thickness of about 300 to 500 Å.

9. The device as set forth in claim 7, wherein a dielectric film deposited in the low and high voltage fields while patterning the second polycrystalline silicon film acts as an etch stopping layer.

10. The device as set forth in claim 7, wherein, the first polycrystalline silicon film is deposited on the overall structure including the pad oxide film, the low voltage gate oxide film, and the high voltage gate oxide film; and a part of the first polycrystalline silicon film in the low and high voltage fields is retained but the other part of the first polycrystalline silicon film from the cell region is removed.

11. The device as set forth in claim 7, further comprising:

a dielectric film on the overall structure including the floating gate; and a control gate to cover the floating gate formed by depositing and patterning a third polycrystalline silicon film on the dielectric film.

* * * * *